United States Patent [19]
Jones

[11] Patent Number: 5,204,983
[45] Date of Patent: Apr. 20, 1993

[54] DUAL CONVERSION REFLEX RECEIVER

[76] Inventor: Thomas J. Jones, 2274 Apricot Dr., Beavercreek, Ohio 45431

[21] Appl. No.: 583,611

[22] Filed: Sep. 17, 1990

[51] Int. Cl.$^5$ .............................................. H04B 15/00
[52] U.S. Cl. ................................ 455/315; 455/316; 455/207
[58] Field of Search .............. 455/207, 209, 314, 315, 455/316, 317; 307/522, 524, 525, 529; 370/69.1; 330/126, 295

[56] References Cited

U.S. PATENT DOCUMENTS

| | | | |
|---|---|---|---|
| 3,311,832 | 3/1967 | Schrader | 455/316 |
| 3,345,573 | 10/1967 | Eschbaugh | 455/315 |
| 3,462,554 | 8/1969 | Steel | 370/69.1 |
| 3,544,899 | 12/1970 | Gusyatinsky et al. | 325/346 |
| 3,769,611 | 10/1973 | Scaggs | 330/126 |
| 4,584,715 | 4/1986 | Baars et al. | 455/302 |
| 4,896,374 | 1/1990 | Waugh et al. | 455/326 |
| 5,027,084 | 6/1991 | Tsukii | 330/295 |

Primary Examiner—Curtis Kuntz
Assistant Examiner—Timothy H. Keough
Attorney, Agent, or Firm—Bernard E. Franz; Donald J. Singer

[57] ABSTRACT

Both the low and high intermediate frequencies (IF) are amplified simultaneously in a single IF amplifier strip. For proper operation it is required that the two IFs be sufficiently isolated from each other so that independent tuning can be achieved. In operation, the RF signal is amplified and mixed down by a first local oscillator (LO). The RF signal is amplified in the IF strip to obtain IF #1. IF #1 from the strip is mixed down with a second LO in a feedback arrangement to obtain IF #2 simultaneously with IF #1 from the strip.

1 Claim, 1 Drawing Sheet

DUAL CONVERSION REFLEX RECEIVER

RIGHTS OF THE GOVERNMENT

The invention described herein may be manufactured and used by or for the Government of the United States for all governmental purposes without the Payment of any royalty.

BACKGROUND OF THE INVENTION

The present invention relates generally to a dual conversion reflex receiver.

Dual conversion receivers generally have a first mixer for converting an RF signal to a first intermediate frequency, a first intermediate frequency amplifier strip, a second mixer for converting the signal to a second intermediate frequency, and a second intermediate frequency amplifier strip, followed by base band circuits.

United States patents of interest include U.S. Pat. No. 4,896,374, to Waugh et al, which teaches a balanced mixer in which RF and LO signals are fed into a 180° hybrid circuit and achieves two IF's at the output combiner circuit. U.S. Pat. No. 3,544,899 to Gusyatinsky et al teaches a FM receiver with decreased threshold levels. U.S. Pat. No. 4,584,715 to Baars et al teaches an image rejection mixer circuit wherein the output from the combiner circuit is a desired signal free from image signals.

SUMMARY OF THE INVENTION

An objective of the invention is to provide an inexpensive receiver with lower parts count, lighter weight, smaller size, and less power consumption than receivers of comparable performance.

The invention relates to a dual conversion receiver which permits both the low and high intermediate frequencies (IF) to be amplified simultaneously in an IF amplifier strip. For proper operation it is required that the two IFs be sufficiently isolated from each other so that independent tuning can be achieved. In operation, the RF signal is amplified and mixed down by a first local oscillator (LO). The RF signal is amplified in the IF strip to obtain IF #1. IF #1 from the strip is mixed down with a second LO in a feedback arrangement to obtain IF #2 simultaneously with IF #1 from the strip.

DETAILED DESCRIPTION

A dual conversion receiver is configured in such a manner that both the low and high intermediate frequencies (IF) are amplified simultaneously by the same intermediate frequency amplifier circuit. All, or only some of the tuned IF stages may be involved in this simultaneous amplifying of both frequencies.

A requirement for proper operation is that the two intermediate frequencies be sufficiently separated so that relatively independent tuning of both the higher and lower can be achieved. A separation of approximately a decade is appropriate under many conditions. Traps can be added between intermediate-frequency stages where necessary.

The receiver has applications where an expendable inexpensive, receiver with low parts count, light weight, small size, and low power consumption is needed. Conservative estimates on physical attributes are:

Weight, <9 oz.
Size, <L=3.5 in., W=2.4 in., H=1.8 in.
Power, <3 watts avg.

Examples of uses include: 1. Remotely piloted drones. 2. Radio controlled missiles with multiple receivers on diverse frequencies. For example, three such receivers tuned to the diverse frequencies, with processing to select the un-jammed frequency.

Airborne antenna applications represents an area where large numbers of this type of receiver could be employed. For instance, future phased array antenna systems conceivably could be configured to use hundreds, up to thousands of receiver modules complete with intermediate frequency amplifiers (IF amps) of this type. Especially in these situations where size is critical, receivers of the proposed type would be of great benefit.

Figure 1:
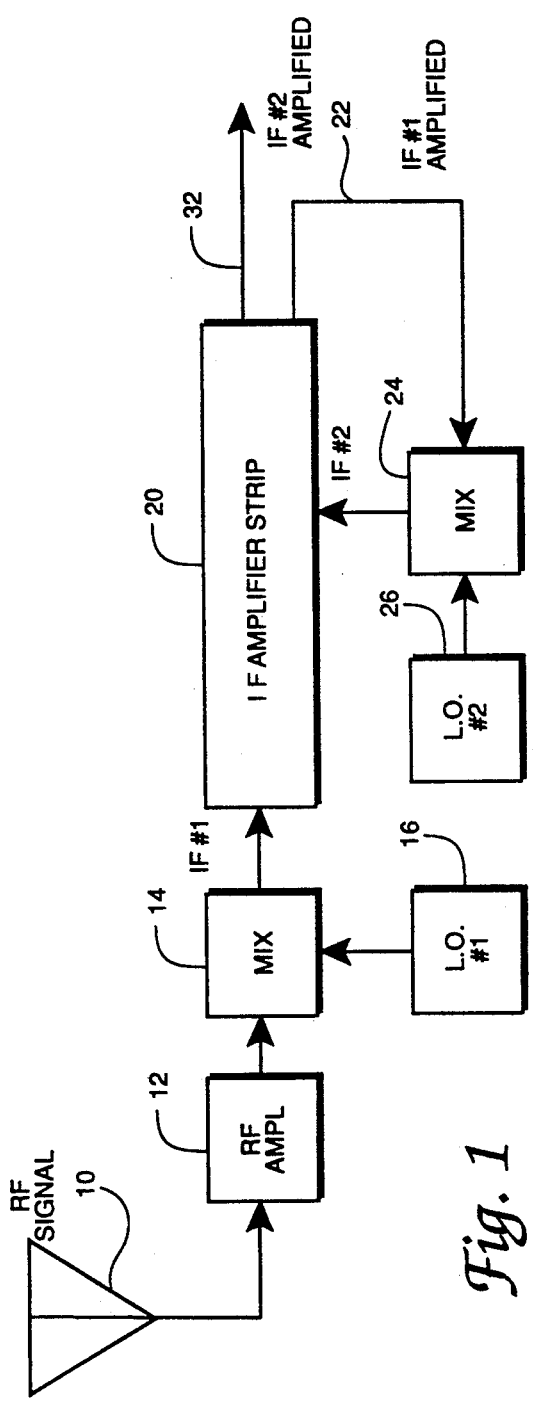
FIG. 1 is a block diagram showing a dual conversion receiver.

As shown in FIG. 1, the dual conversion reflex receiver comprises an antenna 10 coupled via an RF amplifier 12 to a mixer 14. The mixer 14 has a second input from a first local oscillator 16, and the output of the mixer 14 is coupled to an input of the IF amplifier strip 20. A first output of the IF strip 20 at line 22 is connected to a mixer 24. The mixer 24 has a second input from a second local oscillator 26, and the output of the mixer 24 is coupled to a second input of the IF amplifier strip 20. There is a second output of the IF strip at line 32.

OPERATION

1. The RF signal from the antenna 10 is amplified in amplifier 12 and mixed down in mixer 14 by a first local oscillator signal (LO) from the oscillator 16, to produce the intermediate frequency (IF) #1.

2. Intermediate frequency #1 is amplified by stages in the intermediate amplifier strip 20, and output at line 22.

3. The intermediate frequency #1 from the strip is mixed down in mixer 24 with a second (LO) signal from the oscillator 26 to produce the intermediate frequency (IF) #2.

4. Intermediate frequency #2 is amplified by stages in the intermediate amplifier strip 20, and output at line 32. Note: The same Intermediate Frequency Amplifier strip 20 is employed to amplify both intermediate frequencies simultaneously.

5. The amplified intermediate frequency #2 at line 32 is ready for base band processing.

Figure 2:
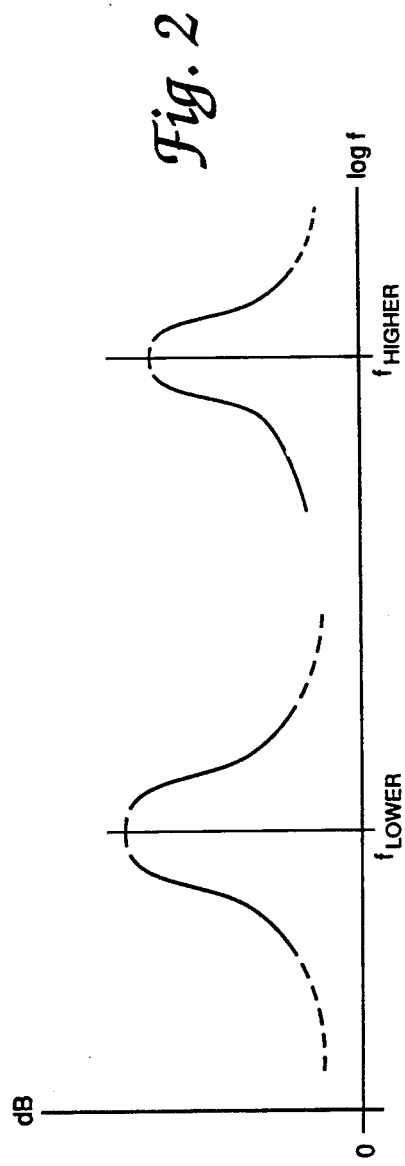
FIG. 2 is a graph of amplitude vs. frequency, showing two intermediate frequencies.

As shown in the graph of FIG. 2, the tuned amplifier of each stage in the Intermediate Frequency Amplifier strip 20 is tunable to both the higher and lower frequencies (f1 and f2) provided f1 and f2 are sufficiently separated.

Note that the Intermediate Frequency Amplifier strip 20 should include some type of circuit for combining the two intermediate frequencies, and circuit means such as a divider or tuned circuits for separating the two output signals at lines 22 and 32.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

An extension to the concept of the dual use of much of the same circuitry in and IF amplifier as disclosed herein, is "multiple" use. That is, portions of an IF amplifier could be used simultaneously at three or more frequencies rather than just two. (This could be called a "Multiplex Receiver"). The advantages of multiple (triple for instance) conversion is much greater image rejection for more interference-free receiver operation.

What is claimed is:

1. A dual conversion reflex receiver including:
   an intermediate frequency amplifier strip having first and second inputs and first and second outputs, means for combining signals at first and second frequencies from the first and second inputs, a plurality of stages for amplifying the signals at the first and second frequencies simultaneously by the same amplifier circuits, and means for separating the signals at the first and second frequencies and supplying them to the first and second outputs respectively;
   first converter means for mixing an RF signal with a first local oscillator signal to produce a signal at a first intermediate frequency which is supplied to said first input, so that the signal at said first output is at said first intermediate frequency; and
   second converter means coupled between said first output and said second input for mixing the signal from the first output with a second local oscillator signal to produce a second intermediate frequency signal which is supplied to said second input, so that the signal at said second output is at said second intermediate frequency, said first output being coupled only to the second converter means.

* * * * *